United States Patent
Ito

(10) Patent No.: US 9,105,322 B2
(45) Date of Patent: Aug. 11, 2015

(54) SOLID STATE DRIVE

(71) Applicant: MURATA MANUFACTURING CO., LTD., Nagaokakyo-Shi, Kyoto-fu (JP)

(72) Inventor: Tomonori Ito, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 0 days.

(21) Appl. No.: 14/157,988

(22) Filed: Jan. 17, 2014

(65) Prior Publication Data

US 2014/0203402 A1 Jul. 24, 2014

(30) Foreign Application Priority Data

Jan. 22, 2013 (JP) ................................ 2013-008957

(51) Int. Cl.
*H01L 21/02* (2006.01)
*G11C 5/14* (2006.01)

(52) U.S. Cl.
CPC *G11C 5/141* (2013.01); *Y02E 60/13* (2013.01)

(58) Field of Classification Search
CPC ................................. G11C 5/141; Y02E 60/13
USPC ................................................. 257/311, 532
See application file for complete search history.

(56) References Cited

U.S. PATENT DOCUMENTS

| 6,064,561 | A * | 5/2000 | Harada et al. ................. 361/502 |
| 6,320,769 | B2 * | 11/2001 | Kurokami et al. ......... 363/56.03 |
| 6,449,139 | B1 * | 9/2002 | Farahmandi et al. ......... 361/502 |
| 7,110,243 | B2 * | 9/2006 | Kawata et al. ................ 361/502 |
| 7,954,006 | B1 * | 5/2011 | Mangipudi ...................... 714/22 |
| 2001/0028546 | A1 * | 10/2001 | Kasahara et al. ............. 361/512 |
| 2002/0191369 | A1 * | 12/2002 | Nakazawa et al. ............ 361/502 |
| 2004/0114309 | A1 * | 6/2004 | Iwaida et al. ................. 361/508 |
| 2004/0146786 | A1 * | 7/2004 | Sato et al. ..................... 429/326 |
| 2006/0092596 | A1 * | 5/2006 | Otsuki et al. ................. 361/502 |

FOREIGN PATENT DOCUMENTS

| JP | H09-308136 A | 11/1997 |
| JP | 2005-064435 A | 3/2005 |
| JP | 2012-174143 A | 9/2012 |

* cited by examiner

*Primary Examiner* — Nicholas Tobergte
(74) *Attorney, Agent, or Firm* — Arent Fox LLP

(57) ABSTRACT

Provided is a solid state drive suitable for an increase in capacity. The solid state drive includes a flash memory, and a capacitor electrically connected to the flash memory. The capacitor is composed of an electric double layer capacitor including an electrolyte solution containing propylene carbonate.

16 Claims, 2 Drawing Sheets

SOLID STATE DRIVE

CROSS-REFERENCE TO RELATED APPLICATION

The present application claims priority to Japanese Patent Application No. 2013-008957, filed Jan. 22, 2013, the entire contents of each of which are incorporated herein by reference.

FIELD OF THE INVENTION

The present invention relates to a solid state drive.

BACKGROUND OF THE INVENTION

In recent years, attempts have been made to use a solid state drive with the use of a flash memory in notebook personal computers, tablet personal computers (tablet PC), etc.

The use of an electrolytic capacitor as a power supply for a flash memory is conceivable, for example, as described in JP 9-308136 A. However, in recent years, flash memories have been increasing in capacity, and the solid state drive with the use of an electrolytic capacitor as a power supply has the problem of being unable to supply sufficient power for the storage of a large quantity of data.

SUMMARY OF THE INVENTION

The present invention is intended to provide a solid state drive suitable for an increase in capacity.

A solid state drive according to the present invention includes a flash memory, and a capacitor electrically connected to the flash memory. The capacitor is composed of an electric double layer capacitor including an electrolyte solution containing propylene carbonate.

In a specific aspect of the solid state drive according to the present invention, the solvent constituting the electrolyte solution contains 80 volume % or greater of propylene carbonate.

According to the present invention, a solid state drive can be provided which is suitable for an increase in capacity.

DETAILED DESCRIPTION OF THE PREFERRED EMBODIMENTS OF THE INVENTION

Figure 1:
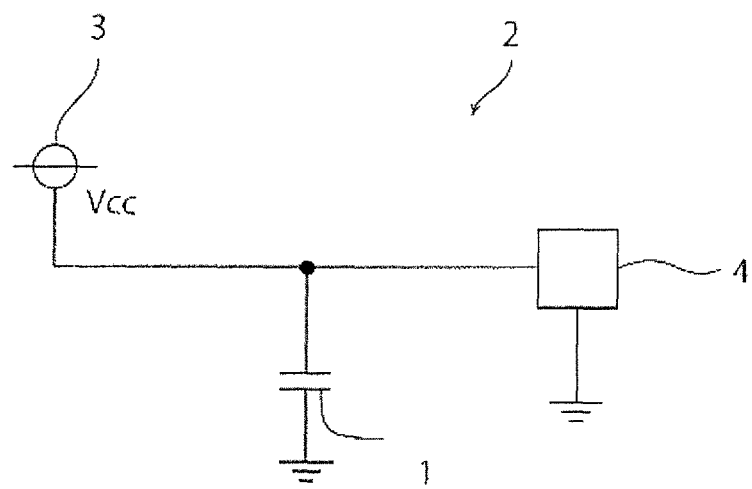
FIG. 1 is a schematic circuit diagram of a solid state drive according to an embodiment of the present invention.

An example of a preferred embodiment for carrying out the present invention will be described below. However, the following embodiment will be given only by way of example. The present invention is not limited to the following embodiment in any way.

In addition, in the respective drawings for reference in the embodiment, etc., members that have substantially the same functions are denoted by the same reference numerals. In addition, the drawings for reference in the embodiment, etc. are made schematically. The ratios in dimension, etc. for objects drawn in the drawings may be different from the ratio in dimension, etc. for the real objects. The dimensional ratios, etc. for the objects may also be different between the drawings. The dimensional ratios, etc. for specific objects should be determined in view of the following description.

As shown in FIG. 1, a solid state drive 2 according to the present embodiment includes a flash memory 4, a capacitor 1, and a direct-current power supply 3. The flash memory 4 is connected between the power supply 3 and the ground potential. The capacitor 1 is connected between the connection point of the flash memory 4 and the power supply, 3 and the ground potential. Power is supplied from the capacitor 1 to the flash memory 4.

It is to be noted that the flash memory 4 is not particularly limited, and may be, for example, a NAND-type flash memory or a NOR-type flash memory.

Figure 2:
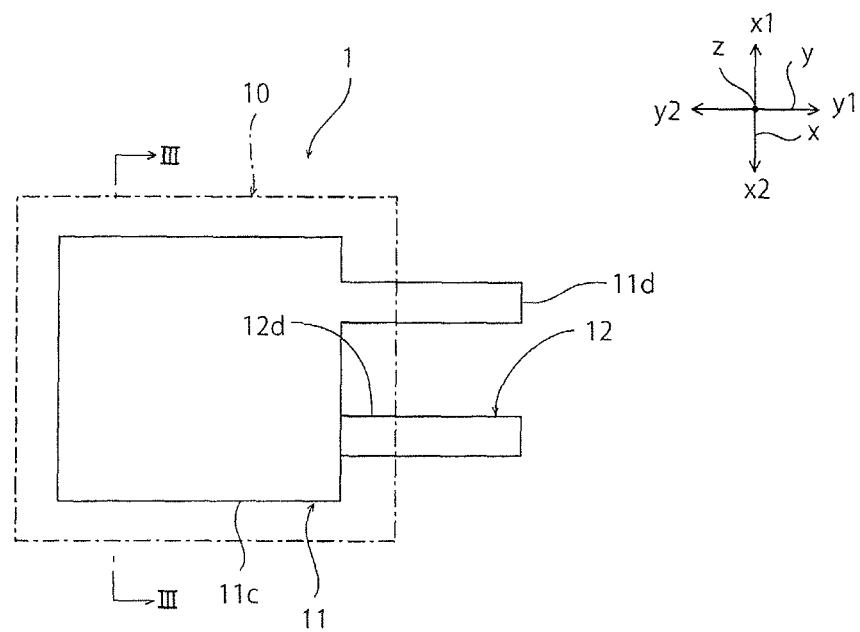
FIG. 2 is a schematic plan view of an electric double layer capacitor according to an embodiment of the present invention.
Figure 3:
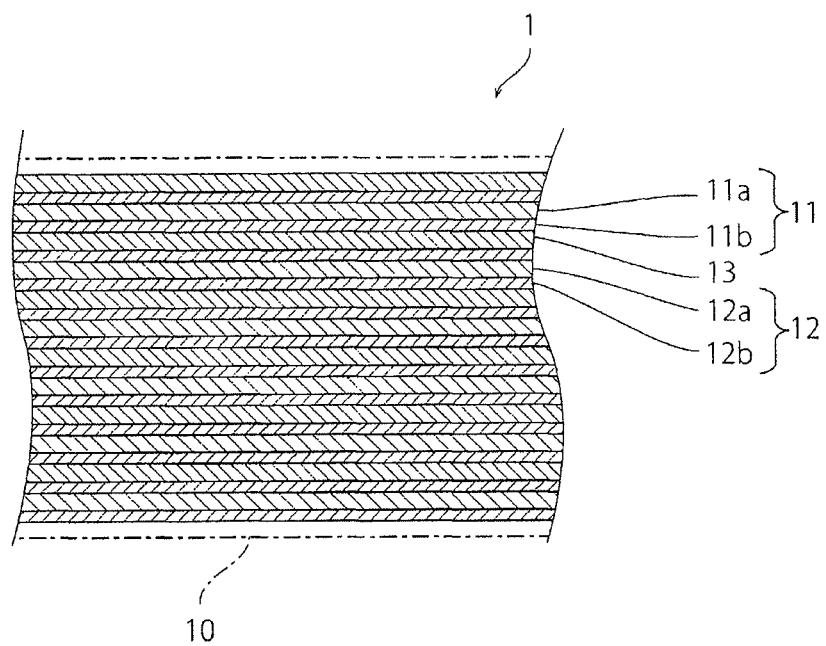
FIG. 3 is a schematic cross-sectional view of FIG. 2 along the line III-III.

In the present embodiment, the capacitor 1 is composed of an electric double layer capacitor as shown in FIGS. 2 and 3.

The electric double layer capacitor 1 includes a plurality of first electrodes 11, a plurality of second electrodes 12, a separator 13 (see FIG. 3), and an exterior body 10.

As shown in FIG. 3, the first electrode 11 includes a current collecting electrode 11a, and a polarizable electrode 11b placed on the current collecting electrode 11a. Likewise, the second electrode 12 includes a current collecting electrode 12a, and a polarizable electrode 12b placed on the current collecting electrode 12a. The current collecting electrodes 11a and 12a can be each composed of, for example, aluminum foil or the like. The polarizable electrodes 11b and 12b are each composed of a porous body. The polarizable electrodes 11b and 12b each preferably contain, for example, a carbon material, platinum, gold, or the like, more preferably contain a carbon material. Preferably used carbon materials include activated carbon. It is to be noted that the current collecting electrodes 11a and 12a can be, for example, on the order of 5 μm to 100 μm in thickness. The polarizable electrodes 11b and 12b can be, for example, on the order of 5 μm to 50 μm in thickness.

As shown in FIG. 2, the first electrode 11 has a first opposed section 11c and a first extraction section 11d which is linear. The first opposed section 11c is opposed to the second electrode 12 (specifically, a second opposed section 12c as described below). The first opposed section 11c is provided in a rectangular shape with a side extending in the x-axis direction and a side extending in the y-axis direction.

The first extraction section 11d extends linearly in the y-axis direction from a y1-side end of the first opposed section 11c in the y-axis direction. The first extraction section 11d is extracted to the outside of the exterior body 10.

The second electrode 12 has the second opposed section 12c and a second extraction section 12d which is linear. The second opposed section 12c is opposed to the first opposed section 11c. The second opposed section 12c is provided in a rectangular shape with a side extending in the x-axis direction and a side extending in the y-axis direction.

The second extraction section 12d extends linearly in the y-axis direction from a y1-side end of the second opposed section 12c in the y-axis direction. The second extraction section 12d is extracted to the outside of the exterior body 10. The second extraction section 12d extends parallel to the first extraction section 11d. The first extraction section 11d and the second extraction section 12d are provided in different positions in the x-axis direction. The first extraction section 11d and the second extraction section 12d have no overlap with each other, as viewed from the z-axis direction. The second extraction section 12d is placed on the x2 side in the x-axis direction, relative to the first extraction section 11d.

The plurality of first electrodes 11 and the plurality of second electrodes 12 are provided alternately so that the first electrodes 11 and the second electrodes 12 are opposed to each other. A separator 13 is provided between the first electrode 11 and the second electrode 12 adjacent to each other. This separator 13 isolates the first electrode 11 and the second electrode 12 from each other.

The first electrodes 11, the second electrodes 12, and the separators 13 are housed in the exterior body 10. In the present embodiment, the exterior body 10 is composed of a laminate body of resin films.

The exterior body 10 is filled with an electrolyte. The electrolyte includes a cation, an anion, and a solvent. Preferably used cations include, for example, a tetraethylammonium salt. Preferably used anions include, for example, tetrafluoroborate ions ($BF^{4-}$) and bistrifluoromethylsulfonylimide (($CF_3SO_2)_2N^-$).

In the electric double layer capacitor 1, the electrolyte contains propylene carbonate as a solvent. The solvent constituting the electrolyte preferably contains 80 volume % or more of propylene carbonate. Further, the electrolyte may further contain, for example, ethylene carbonate, diethyl carbonate, dimethyl carbonate, or the like as a solvent.

As described above, the electric double layer capacitor 1 is used as a power supply source for the flash memory in the present embodiment. For this reason, a large amount of power can be supplied to the flash memory, as compared with a case of using an electrolytic capacitor as a power supply source for the flash memory. In addition, the electrolyte of the electric double layer capacitor 1 contains propylene carbonate. For this reason, the electric double layer capacitor 1 has excellent heat resistance. Therefore, the solid state drive according to the present embodiment is capable of increasing the capacity of the flash memory, and of achieving excellent durability and excellent reliability.

While the present invention will be described below in more detail with reference to a specific example, the present invention is not to be considered limited to the following example in any way, and appropriate modifications can be made in the practice of the invention without departing from the scope of the invention.

Example 1

An electric double layer capacitor configured in substantially the same fashion as the electric double layer capacitor 1 described in the above embodiment was prepared by the following method.

Negative Electrode Side Collecting Electrode: Aluminum Foil
Negative Electrode Side Polarizable Electrode: 30 μm Thick Porous Body of Activated Carbon
Positive Electrode Side Collecting Electrode: Aluminum Foil
Positive Electrode Side Polarizable Electrode: 30 μm Thick Porous Body of Activated Carbon
Number of Positive Electrodes and Negative Electrodes Stacked: 10 Layers
Electrolyte: Propylene Carbonate (PC) containing 1.5 mol/liter of 5-azoniaspiro[4,4]nonane tetrafluoroborate (SBPBF4)
Designed Electrostatic Capacitance (CAP): 700 mF±20%
Designed Equivalent Series Resistance (ESR): 70 mΩ

Comparative Example 1

Except for the use of triethylmonomethyl tetrafluoroborate (TEMABF4) as an electrolyte dissolved in acetonitrile (electrolyte concentration: 1.5 mol/L) for an electrolyte solution, an electric double layer capacitor was prepared in the same way as in Example 1.

Comparative Example 2

Except for the use of triethylmonomethyl tetrafluoroborate (TEMABF4) as an electrolyte dissolved in propionitrile (electrolyte concentration: 1.5 mol/L), an electric double layer capacitor was prepared in the same way as in Example 1.

Comparative Example 3

Except for the use of 5-azoniaspiro[4,4]nonane tetrafluoroborate (SBPBF4) as an electrolyte dissolved in gamma butyrolactone (electrolyte concentration: 1.5 mol/L), an electric double layer capacitor was prepared in the same way as in Example 1.

(Evaluation)

Under an atmosphere of 70° C., a load test was carried out in which a voltage of 2.1 V was applied for 2000 hours or 4000 hours. The ESR and CAP for the electric double layer capacitors before conducting the load test were measured in conformity with EIAJ RC-2377. In addition, the ESR and CAP after conducting the load test for 2000 hours, as well as the ESR and CAP after conducting the load test for 4000 hours were measured in the same way. From the results, the expected life periods were calculated. The results are shown in Table 1.

TABLE 1

|  | Expected Life Period Calculated from Change in ESR | Expected Life Period Calculated from Change in CAP |
| --- | --- | --- |
| Example 1 | 7.5 years | 8.6 years |
| Comparative Example 1 | 1 year or shorter | 1 year or shorter |
| Comparative Example 2 | 1 year or shorter | 1 year or shorter |
| Comparative Example 3 | 4 years or shorter | 4 years or shorter |

From the results shown in FIG. 1, it is determined that the use of propylene carbonate as the electrolyte achieves an electric double layer capacitor which is excellent in heat resistance and reliability.

What is claimed is:
1. A flash SSD comprising;
an electric double layer capacitor comprising an electrolyte solution including a propylene carbonate; and
a flash memory electrically connected to the electric double layer capacitor,
wherein the electric double layer capacitor has an electrostatic capacitance that is equal to or greater than 560 mF and that is equal to or less than 840 mF.
2. The flash SSD according to claim 1, wherein the electrolyte solution comprises a solvent containing at least 80% by volume of the propylene carbonate.
3. The flash SSD according to claim 1, wherein the flash memory is one of a NAND-type flash memory or a NOR-type flash memory.
4. The flash SSD according to claim 1, wherein the electric double layer capacitor includes a plurality of first electrodes and a plurality of second electrodes.

5. The flash SSD according to claim 4,
wherein the plurality of first electrodes each include a current collecting electrode and a polarizable electrode disposed on the current collecting electrode, and
wherein the plurality of second electrodes each include a current collecting electrode and a polarizable electrode disposed on the current collecting electrode.

6. The flash SSD according to claim 5, wherein each of polarizable electrodes contain at least one of a carbon material, platinum or gold.

7. The flash SSD according to claim 5, wherein each of polarizable electrodes comprises a porous body.

8. The flash SSD according to claim 5,
wherein each of current collecting electrodes has a thickness between 5 µm to 100 µm, and
wherein each of the polarizable electrodes has a thickness between 5 µm to 50 µm.

9. The flash SSD according to claim 4, wherein each of the plurality of first electrodes comprises a first extraction section and each of the plurality of second electrodes comprises a second extraction section.

10. The flash SSD according to claim 9, wherein the first extraction sections and the second extraction sections are linear.

11. The flash SSD according to claim 9, wherein each of the first extraction sections extends in a direction parallel to the second extraction sections.

12. The flash SSD according to claim 9, wherein the electric double layer capacitor further comprises an exterior body configured to house the plurality of first electrodes and the plurality of second electrodes.

13. The flash SSD according to claim 12, wherein the exterior body comprise a laminate body of resin films.

14. The flash SSD according to claim 12, wherein each of the first extraction section and the second extraction section are extracted outside of the exterior body.

15. The flash SSD according to claim 4, further comprising a plurality of separators each disposed between a first electrode and a second electrode to isolate the first electrode from the second electrode.

16. The flash SSD according to claim 1, wherein the electrolyte solution further comprises a solvent selected from the group consisting of ethylene carbonate, diethyl carbonate, and dimethyl carbonate.

* * * * *